US012791591B2

(12) United States Patent
Lazenby

(10) Patent No.: US 12,791,591 B2
(45) Date of Patent: Nov. 10, 2026

(54) ENGAGEABLE ELECTRIC CONNECTOR FOR SUPPLEMENTAL ELECTRIC CIRCUIT

(71) Applicant: Trent Lazenby, Santaquin, UT (US)

(72) Inventor: Trent Lazenby, Santaquin, UT (US)

( * ) Notice: Subject to any disclaimer, the term of this patent is extended or adjusted under 35 U.S.C. 154(b) by 68 days.

(21) Appl. No.: 18/648,262

(22) Filed: Apr. 26, 2024

(65) Prior Publication Data

US 2024/0361364 A1 Oct. 31, 2024

Related U.S. Application Data

(60) Provisional application No. 63/462,203, filed on Apr. 26, 2023.

(51) Int. Cl.

| | |
|---|---|
| ***G01R 19/25*** | (2006.01) |
| ***G01R 15/12*** | (2006.01) |
| ***G01R 15/14*** | (2006.01) |
| ***G01R 19/00*** | (2006.01) |
| ***G01R 19/30*** | (2006.01) |
| ***G01R 21/133*** | (2006.01) |
| ***G01R 22/06*** | (2006.01) |
| ***G01R 31/26*** | (2020.01) |
| ***H01R 24/54*** | (2011.01) |
| ***H01R 31/06*** | (2006.01) |
| *G01R 21/06* | (2006.01) |

(52) U.S. Cl.

CPC ......... *G01R 19/2513* (2013.01); *G01R 15/12* (2013.01); *G01R 15/144* (2013.01); *G01R 19/00* (2013.01); *G01R 19/30* (2013.01); *G01R 21/1331* (2013.01); *G01R 22/063* (2013.01); *G01R 22/065* (2013.01); *G01R 31/261* (2013.01); *G01R 31/2623* (2013.01); *H01R 24/542* (2013.01); *G01R 21/06* (2013.01); *H01R 31/065* (2013.01)

(58) Field of Classification Search

CPC ........... G01R 19/2513; G01R 21/1331; G01R 22/063; G01R 22/06; G01R 22/065; G01R 15/12; G01R 15/144; G01R 19/00; G01R 19/30; G01R 21/06; G01R 31/261; G01R 31/2623; H01R 24/542; H01R 31/065

USPC ...................................................... 324/76.11

See application file for complete search history.

(56) References Cited

U.S. PATENT DOCUMENTS

| | | | | |
|---|---|---|---|---|
| 2016/0380413 | A1* | 12/2016 | Cruz .................... | G01R 22/065 361/668 |
| 2017/0212160 | A1* | 7/2017 | Fulton ...................... | H02H 3/08 |
| 2017/0322283 | A1* | 11/2017 | Schweitzer ............ | G01R 35/04 |
| 2019/0346506 | A1* | 11/2019 | Schamber .............. | G01R 22/10 |
| 2020/0319249 | A1* | 10/2020 | Schamber .............. | G01R 22/10 |
| 2021/0096163 | A1* | 4/2021 | May ........................ | H01F 38/28 |
| 2022/0311197 | A1* | 9/2022 | Ferree ..................... | B60L 53/16 |

* cited by examiner

*Primary Examiner* — Raul J Rios Russo

(74) *Attorney, Agent, or Firm* — Donn K. Harms

(57) ABSTRACT

An electric power interface features a body which is positionable in a sandwiched mount between an existing electric power meter and the mounting bracket for the electric meter. So positioned it allows for the formation of a secondary electric circuit extending from the body which may have electric current flowing therethrough measured by the original power meter or by a secondary power meter.

5 Claims, 5 Drawing Sheets

ENGAGEABLE ELECTRIC CONNECTOR FOR SUPPLEMENTAL ELECTRIC CIRCUIT

FIELD OF THE INVENTION

The present device relates to electric wiring for homes and businesses. More particularly, the disclosed device and system relate to an engageable interface component for positioning between the electric meter and the main electric panel which provides for a secondary electric circuit employable for communicating electricity to a sub panel or other connection.

BACKGROUND OF THE INVENTION

In most modern countries electric power is supplied to customers over a wired grid which communicates electric power from a generating source, over wires, to users of the electricity. Conventionally, the electric power from the grid supplier is communicated to a home or business through an electric meter which is connected to an electric panel having circuit breakers which connect individual circuits to the electric power supplied through the meter from the grid.

Many homes and businesses, over time, have electric panels which may me maximized as to the ability to provide new circuits to communicate electric power to newly acquired appliances or other devices which require electricity to operate.

More recently, with the rising popularity of electric and hybrid vehicles which use battery power to operate, it has become a significant problem to provide electric circuits to run a battery charger for the vehicle. Such chargers, to be efficient and to charge a vehicle within a reasonable amount of time, conventionally, require 240 volt single phase electric power. Such higher voltage and higher amperage requirements of vehicle chargers may not be installable where the current electric panel has circuits already using the maximum rated amperage for that electric panel. Still further, where public utilities offer a discount for electric power used for vehicle charging, in most areas such requires the installation by an electrician of a subpanel and secondary circuits at a cost for the power user.

As a consequence, owners of such vehicles are left with the unenviable choice of replacing their current electric panel with one rated for higher amperage and providing more circuit breaker connections or not having a vehicle charger which will operate at faster charging speeds.

The forgoing background concerning conventional electric connections and electric panels and limitations related therewith are intended to be illustrative and not exclusive, and they do not imply any limitations on the supplemental circuit system and invention described and claimed herein. Various other limitations of the related art of home and business electric wiring are known or will become apparent to those skilled in the art upon a reading and understanding of the specification below and the accompanying drawings.

It is an object of this invention to provide a device and system which is easily operatively engageable between a utility electric meter and the electric distribution panel being metered by the electric meter, to provide a supplemental circuit for a direct or sub panel connection to a device requiring electric power.

It is an additional object of this invention to provide such an interface connection which will communicate power to a sub panel or appliance or the like, at voltages or amperages which would not be available with the circuits available on the existing electric panel.

It is a further object of this invention to provide such an interface that is easily engaged between the electric meter and electric panel and provides an electric connection configured to support vehicle charging or to provide power to appliances requiring such electric power.

It is a further object to provide an electric meter system which allows for the easy positioning of a secondary electric circuit for vehicle charging which may be installed by the electric company through the easy installation of an interface between the existing meter and the power panel from the utility.

It is yet another object of this invention to provide an electric meter interface system which includes a secondary meter which tracks only the electric power used by a secondary circuit exiting the interface thereby allowing for different electric power prices for the secondary circuit from that of the primary meter.

These and other objects, features, and advantages of the present electric interface, positionable between the electric meter and metered electric panel herein, as well as the advantages thereof over existing prior art, which will become apparent from the description to follow, are accomplished by the device and system described in this specification and hereinafter described in the following detailed description which fully discloses the invention, but should not be considered as placing limitations thereon.

SUMMARY OF THE INVENTION

The present invention provides for supplemental electric power circuits for the electrical system for a home or business. The device and system herein is especially useful where the maximum amperage or maximum number of circuit breakers providing circuit legs in a home or business has been reached.

Additionally, with the advent of vehicles which have batteries which are charged at home or at a business, the device and system herein solves an especially vexing problem of monitoring power used to charge a vehicle separate from electric power used for home or business systems. The device herein employing a simple interface body positioned between the power company line and the breaker box of a home or business, provides for the inclusion of secondary metering either by monitoring electric power routed to the supplement circuit with an internal electronic component, or by the simple inclusion of a second power meter which tracks the electric power used by the supplement electric circuit.

The device herein allows for an easy positioning upon conventional electric panels through the provision of a housing or body that is engageable in a sandwiched engagement between the electric meter of the local utility and the electric panel of the residence or business. With such meters and the mounts therefor being substantially standard as to the electric connectors position and their engagement, the device herein provides a mount for the electric meter on a first side which is operatively engageable with the conventional electric connectors of the meter. This configuration allows utility workers who are well versed in positioning meters, but are not licensed electricians capable of installing new wiring and conduit, to easily install the housing between an existing electric meter and the electric panel in the same manner in which they install an electric meter. Thus the utility may offer different billing rates to users having the device which can be installed by the utility.

The housing has on an opposite side of the body or housing, mating electric connectors which are configured to operatively engage the conventional electric panel or distribution housing which delivers utility electric power to a home or business. The device thus has a body or housing that is easily engageable between a conventional electric meter and electric panel in a sandwiched positioning therebetween by power company personnel.

With the body of the device engaged between the meter and the electric panel, it will provide electric power connections to the electric panel in the conventional fashion where such electric current or power is tracked by the electric meter. The device, so installed, will also provide an electric current output to a secondary circuit which can be employed to provide electric power to some other electric-using device. Such may be simply a sub-panel where the device is employed to provide power in situations where no more circuit breakers are available. Also, as noted, such a secondary eclectic circuit may be employed to charge an electric vehicle or the like.

In the mounted position, the device preferably also includes a circuit monitoring component which monitors and determines a first amount of electric current used by the originally installed electric panel as well as a second amount of electric current used by the electric component or components engaged to the secondary circuit. This circuit monitoring component may be configured with operative electronic circuitry and if needed, computer processors and memory and software to track both the first amount of electric current and the second amount of electric current, separably. Alternatively, the device may be configured to position a second power meter on the secondary circuit which will monitor electric current used thereby. Where the electric meter is what is known as a smart meter, this second meter can electronically report to the utility, the electric current used be the secondary circuit while the primary electric meter which remains installed will report the electric current used by the rest of the system.

Thus, where a smart meter is employed on the home or business, which transmits to the utility the amount of electric current being used or was used in the previous billing cycle by the location of the meter, the monitoring component will also be operatively engaged to the smart meter to allow the separate reporting to the utility of the first amount of electric current used by the original panel and circuits and the second amount of electric current used by the secondary circuits. This is most preferred in that where a vehicle charger is engaged to the secondary circuit, the second amount of electric current used by that charger can be reported to the electric utility. This will allow the utility to bill the user at a different rate for the electric current used to charge the vehicle from the rate charged for the first amount of electric current used by the main or original electric panel and circuits connected thereto.

The secondary circuit, communicated from the body of the device once in the sandwiched mounting between the meter and the ordinally installed electric panel, can be configured to the local or state code requirements for such a circuit. This may include the use of conduit or exterior rated wiring and a sub panel housing one or a plurality of circuit breakers which will be operatively connected to one or a plurality of devices using the second amount of electric current provided by the secondary circuit.

With respect to the above description, before explaining at least one preferred embodiment of the electric interface, positionable between the electric meter and metered electric panel herein in detail, it is to be understood that the invention is not limited in its application to the details of construction and/or to the arrangement of the steps in the system in the following description or illustrated in the drawings. The electric power interface device and system herein described, is capable of other embodiments and of being practiced and carried out in various ways which will become obvious to those skilled in the art on reading this disclosure. Also, it is to be understood that the phraseology and terminology employed herein are for the purpose of description and should not be regarded as limiting.

As such, those skilled in the art will appreciate that the conception upon which this disclosure is based, may readily be utilized as a basis for other interface devices which are positionable between the electric meter and metered electric panel. It is important, therefore, that the claims herein be regarded as including such equivalent construction and methodology for such meter and panel interfaces insofar as they do not depart from the spirit and scope of the present invention.

As used in the claims to describe the various inventive aspects and embodiments, "comprising" means including, but not limited to, whatever follows the word "comprising". Thus, use of the term "comprising" indicates that the listed elements are required or mandatory, but that other elements are optional and may or may not be present. By "consisting of" is meant including, and limited to, whatever follows the phrase "consisting of". Thus, the phrase "consisting of" indicates that the listed elements are required or mandatory, and that no other elements may be present. By "consisting essentially of" is meant including any elements listed after the phrase, and limited to other elements that do not interfere with or contribute to the activity or action specified in the disclosure for the listed elements. Thus, the phrase "consisting essentially of" indicates that the listed elements are required or mandatory, but that other elements are optional and may or may not be present depending upon whether or not they affect the activity or action of the listed elements. The term "substantially", unless otherwise specifically defined, means plus or minus five percent.

These and other objects, features, and advantages of the disclosed and described electric interface apparatus for positioning between the electric meter and metered electric panel as disclosed herein, as well as the advantages thereof over existing prior art, will become apparent from the description to follow. Such are accomplished by the improvements described in this specification and hereinafter described in the following detailed description which fully discloses the system herein, but should not be considered as placing limitations thereon.

BRIEF DESCRIPTION OF DRAWING FIGURES

The accompanying drawings, which are incorporated herein and form a part of the specification, illustrate some, but not the only or exclusive examples of embodiments and/or features of the disclosed electric power interface which is configured to be easily positionable between the electric meter and metered electric panel without modifications to the panel itself. It is intended that the embodiments and figures disclosed herein are to be considered illustrative of the invention herein, rather than limiting in any fashion.

Figure 2:
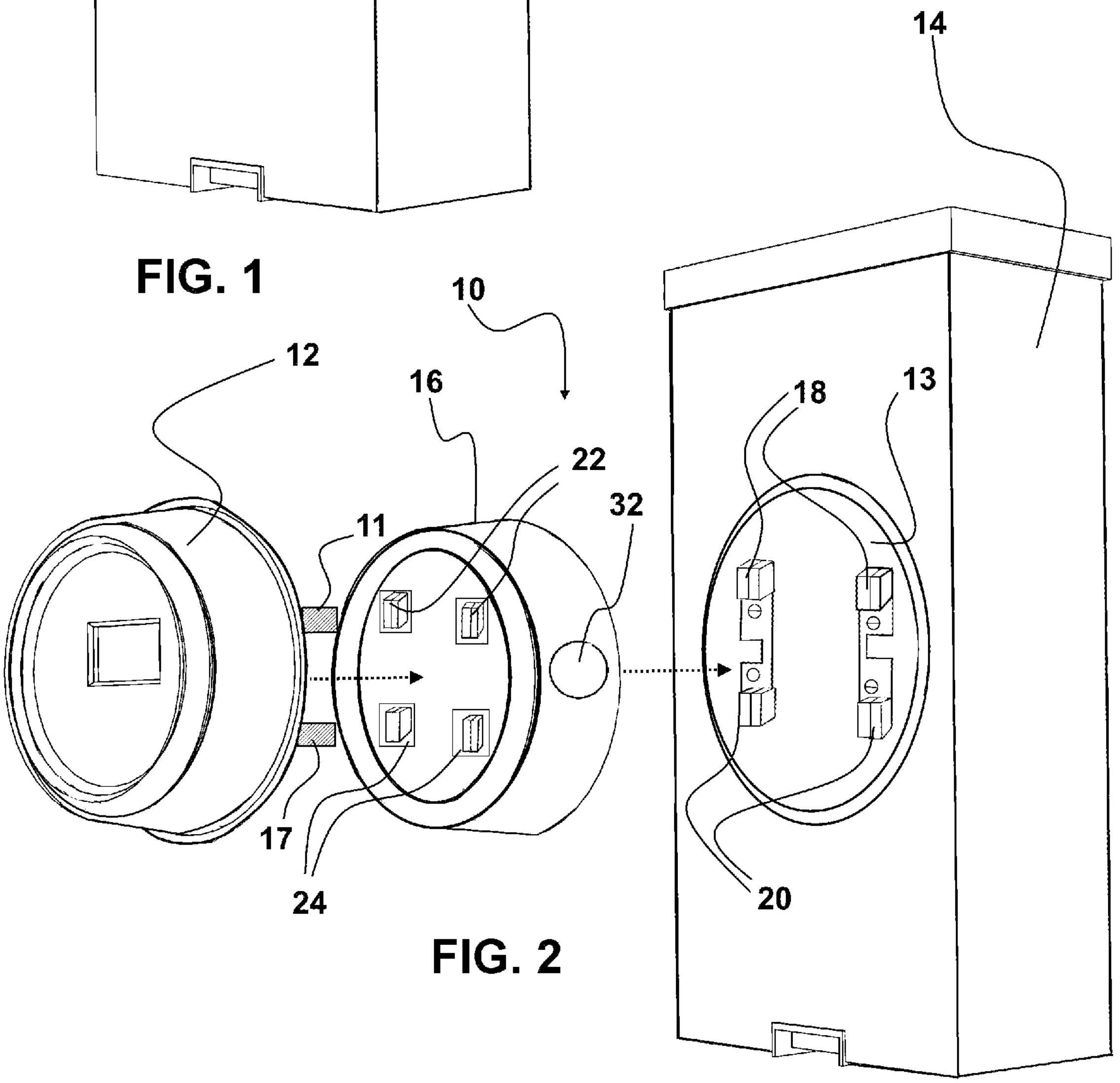
FIG. 2 shows the device herein having a body configured for a sandwiched engagement between the electric meter and the connection to the electric panel being supplied.
Figure 3:
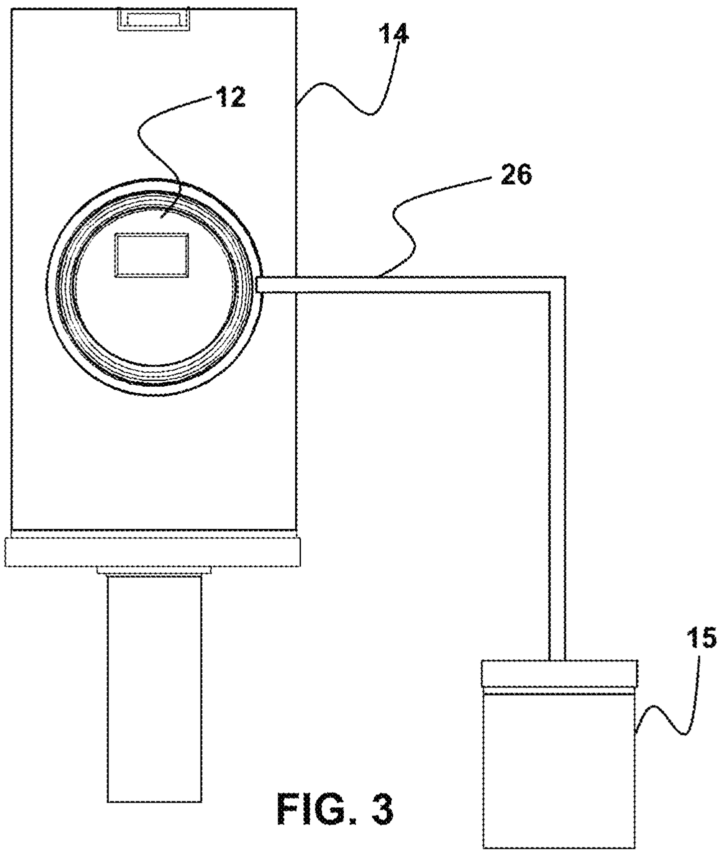
FIG. 3 shows the device herein having the interface body operatively engaged between the meter and the output connectors circuit providing electricity to a distribution panel, wherein a secondary output circuit is provided to communicate electric power from the interface to an electric sub panel.
Figure 4:
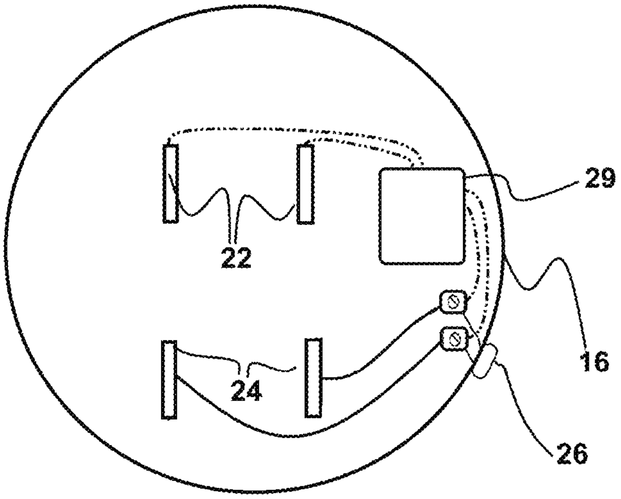

FIG. 4 depicts, in simple format, the rear of the body of the device as in FIG. 2 herein showing a secondary output connector which is to be engaged to the original electric panel and a secondary circuit for electric power which is engaged from the secondary output connectors to electric connections for a second or supplemental circuit and showing the electric current flow monitoring component which will track and report upon the amount of electric current used by each of the original electric panel and the supplemental circuit separately.

Figure 5:
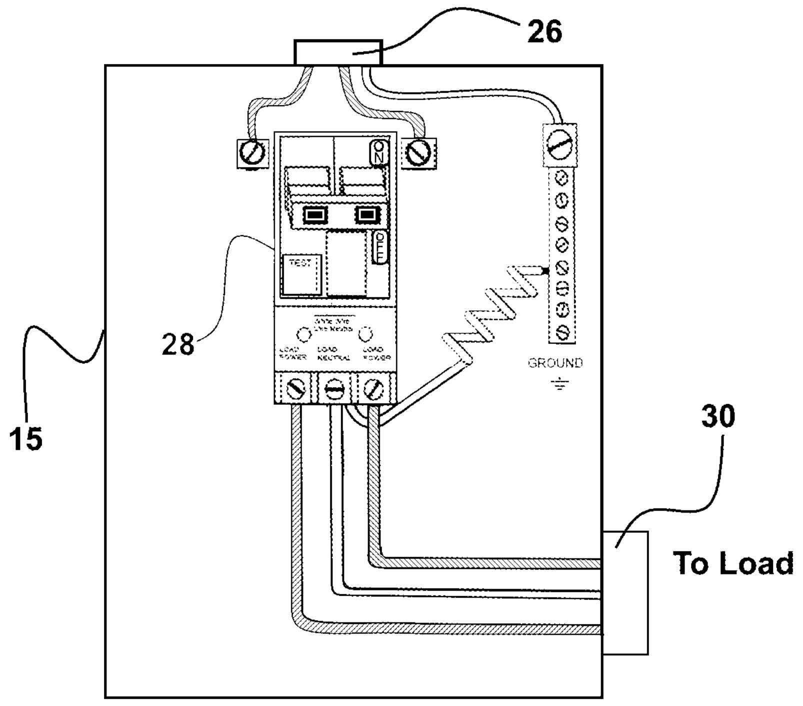

FIG. 5 shows one mode of the internal circuitry of a sub panel wherein a GFI circuit breaker receives electric power communicated from the secondary output connectors of the interface device and provides such to a load.

Figure 6:
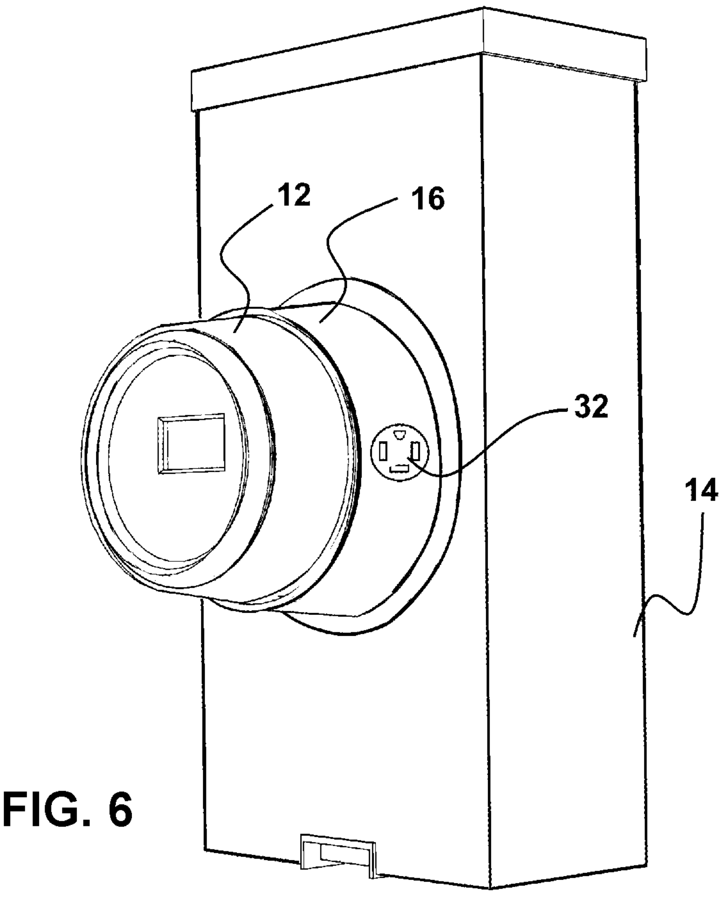

FIG. 6 depicts a similar mode of the system which positions an electrical outlet operatively connected to the secondary output connectors and located on the body of the interface itself.

Figure 7:
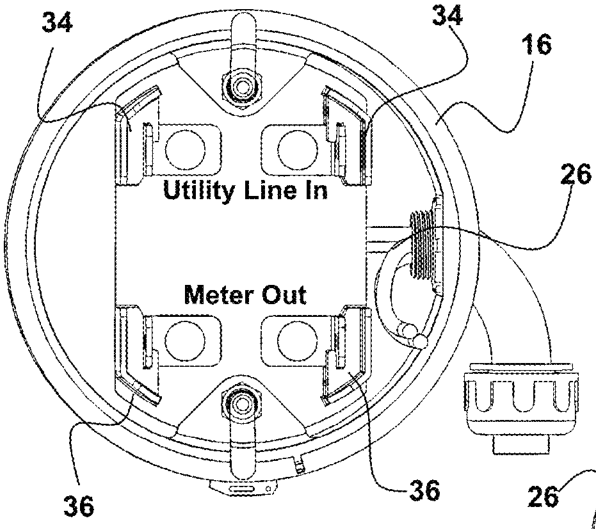

FIG. 7 depicts a rear view of the body of the device herein showing the first pins connected to the secondary input connector and second pins connected to the secondary output connector.

Figure 8:
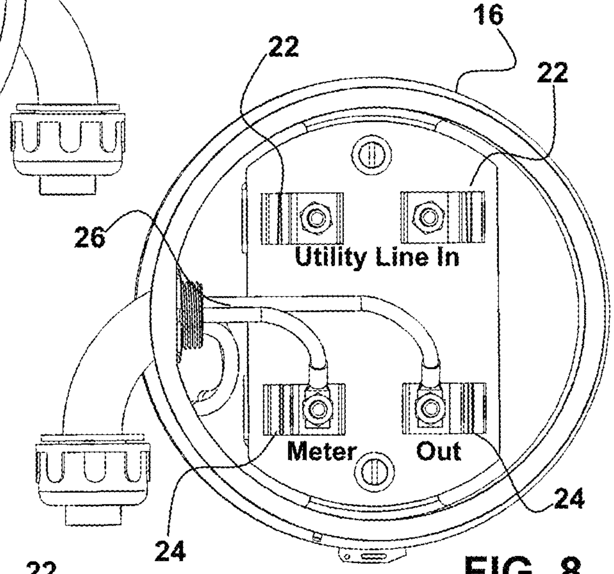

FIG. 8 is an opposite side of the body view of the device as in FIG. 7.

Figure 9:
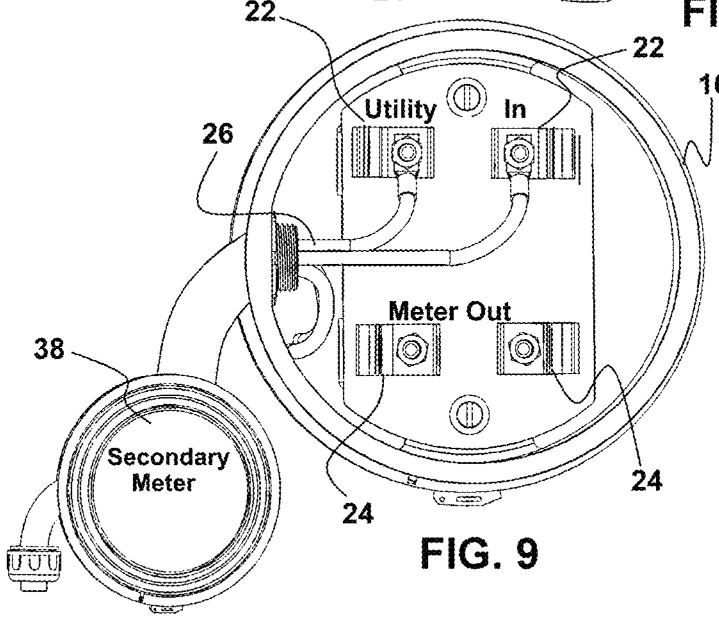

FIG. 9 shows a mode of the device having the same pin connectors as FIG. 7 but having a separate current flow to a secondary meter which measures the electric current supplied to a load on a secondary output circuit.

Figure 10:
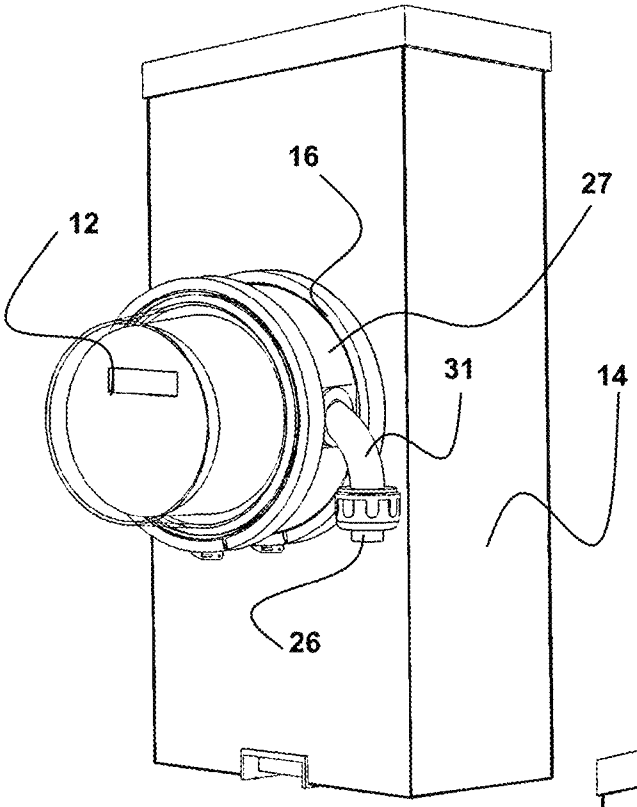

FIG. 10 depicts the device as in FIGS. 7-8 in operative position sandwiched between the utility meter and the original connector bracket 13.

Figure 11:
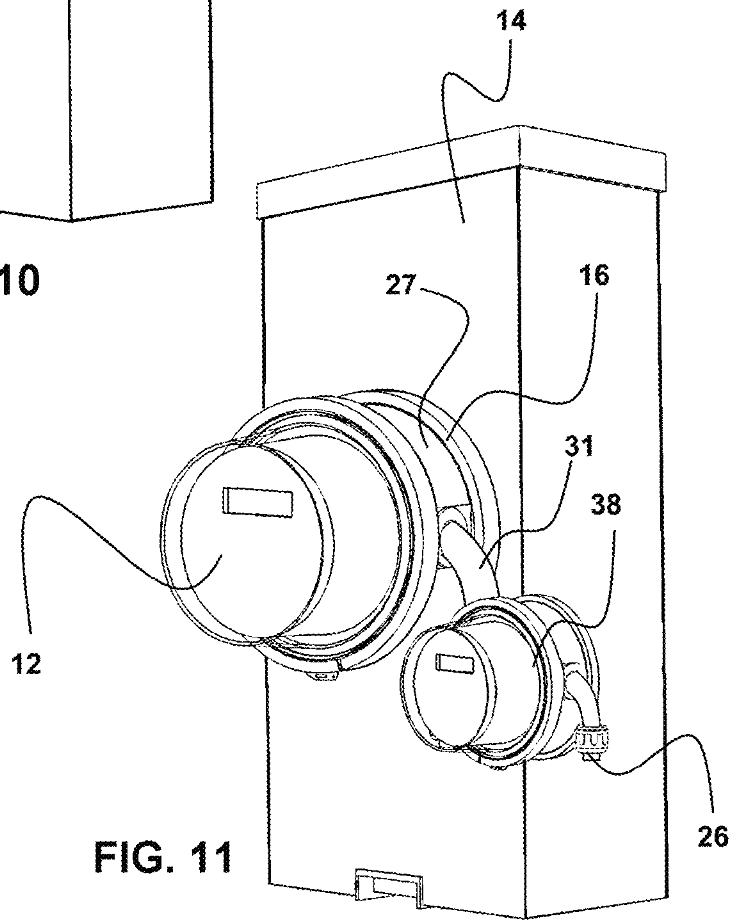

FIG. 11 depicts a preferred mode of the device herein as I FIG. 9 wherein a secondary meter is positioned to measure electric current supplied to the secondary output circuit.

DETAILED DESCRIPTION OF THE INVENTION

In this description, the directional prepositions of up, upwardly, down, downwardly, front, back, top, upper, bottom, lower, left, right, first, second, and other such terms refer to the electric power interface system as it is oriented and appears in the drawings and all such terms are used for convenience only and such are not intended to be limiting or to imply that the interface device has to be used or positioned in any particular orientation.

Figure 1:
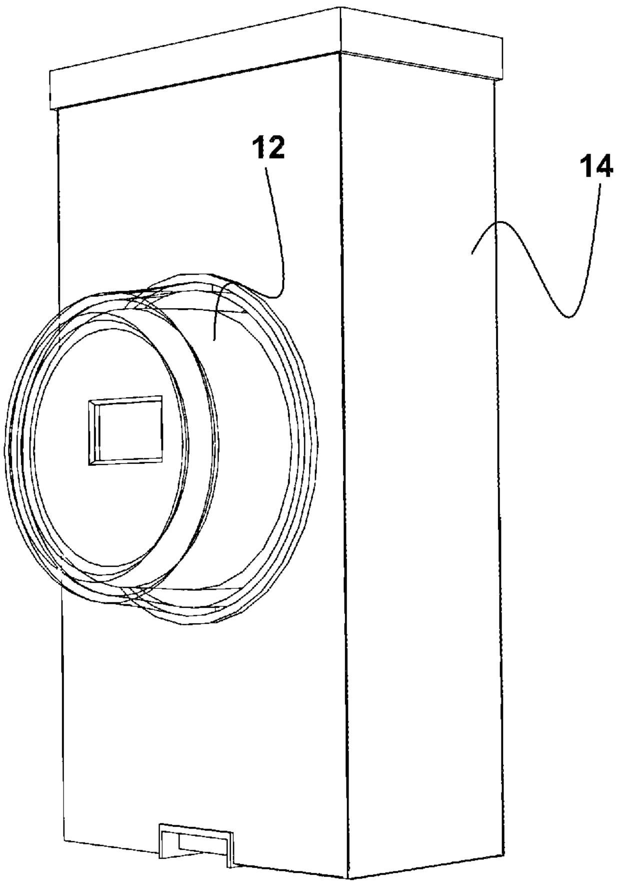
FIG. 1 depicts a conventional and well-known configuration wherein an electric panel is provided electricity from a utility where the amount of electricity, so provided, is measured by a meter.

Now referring to drawings in FIGS. 1-11, there is seen in FIG. 1 a conventional and well-known configuration for electric power provided by a utility over the grid, to a home or commercial property. Conventionally, an electric meter 12 for measuring an amount of electric current is positioned to measure power from the grid, which is communicated to a service panel 14, also referred to a breaker box, or fuse box, or other conventional terms to describe the housing in which multiple circuit breakers operatively engage to bus bars connected to the grid, through the meter 12. Such service panels 14 may be remote to the mounting housing on which the electric meter is engaged.

In FIG. 2 is depicted the device 10 herein showing a body 16 which is configured for an operative engagement in between the first meter connector pins 11 and second meter connection pins 17 of a power meter 12 and the connector bracket 13 which may be mounted on the service panel 14 or may be remote thereto where metered electric current is communicated from the output of the meter 12 to the service panel 14 using a conduit and wiring.

The connector bracket 13 in conventional electric power systems in the U.S. and many countries has bracket input electric connectors 18 which communicate electric power from the grid through the meter 12 to bracket output connectors 20 which are operatively electrically connected to the bus bars (not shown but well known) on the service panel 14. These bus bars conventionally electrically engage with individual fuses or circuit breakers which provide electric power circuits to the home or business.

The meter 12 is configured to form an electrical engagement with meter connector pins 11 and 17, which operatively engage with bracket input connectors 18 and bracket output connectors 20 in the connector bracket 13, in a well-known pin and socket engagement of meters 12 with such brackets 13 by major electric power utilities. The meter 12, so connected, will measure the amount of electric current which is used when communicated from the bracket input connector 18 to the bus bars and circuits of the service panel 14. Thus, a television or blender or lights connected to wires or circuits running from the service panel 14 which use electric current therefrom will have an electric meter 12 which will measure and track the total aggregate amount of electric current used over a time duration. Conventionally, this may be one month or in some cases by the hour where the user pays for electric power depending on the time of day.

As depicted in FIG. 2, the meter 12 and the connector bracket 13 having bracket input connectors 18 communicating electric current from a utility and bracket output connectors 20 which communicate that electric current to the home or office once it has been measured by the meter 12 positioned thereon. As noted, the connector bracket 13 may be positioned on a separate housing or on the service panel 14 depending on local building codes and the overall construction of the home or office. In many cases, this service panel 14 may be remote in order to place it inside the residence or building or in a convenient location in a building to allow access to fuses or circuit breakers therein. Such service panels 14 as noted conventionally employ a pair of bus bars thereof which are in a wired electrical connection to the bracket output connections 20 of the connector bracket 13.

The body 16 of the device and system herein is configured to be positioned between the meter 12 and the connector bracket 13, in a mounted position. Such a possible mounting position is shown for example in FIG. 3 and FIGS. 6 and 10-11. In this mounted position, the bracket input connectors 18 on the connector bracket 13 engage with secondary input connectors 22 positioned on the body 16. The bracket output connectors 20 on the connector bracket 13 will operatively engage with secondary output connectors 24 positioned on the body 16.

These secondary input connectors 22 and secondary output connectors 24 are configured and positioned to electrically, operatively engage with the original connections of the meter 12. Conventionally these original meter connections are engaged directly to the bracket input connectors 18 on the connector bracket 13 and the bracket output connectors 20 thereon. This configuration of the body 16 and connectors thereon makes for a simple operative positioning of the device 10 herein which is accomplished by removing the meter 12 from the original engagement to the connector bracket 13.

Once the meter 12 is removed, the body 16 of the device 10 herein is operatively engaged to the connecter bracket 13 by connecting the secondary input connectors 22 to the bracket input connectors 18 and concurrently engaging the secondary output connectors 24 to the bracket output connectors 20 on the connector bracket 13. Conventionally, such connections are a pin and socket connection and such would be the preferred manner herein.

With the body 16 engaged with the connector bracket 13 the supplemental input connectors 22 are electrically engaged to the bracket input connectors 18 and the supplemental output connectors 24 are electrically engaged to the bracket output connectors 20 of the bracket 13. The meter 12 may be operatively engaged to the body 12 16 by insertion of the first meter connection pins 11 into the secondary input connectors 22 and the second meter connection pins 17 into the secondary output connectors 24.

In one preferred mode of the device 10 herein, this operative engagement will operatively electrically engage the meter connector pins 11 and 17 to the original grid bracket input connectors 18 and electric panel bracket output connectors 20 through the body 16 of the device. This sandwiched positioning of the body 16 will also form in electrical connections through the meter 12 to the secondary output connectors 24 and on to the bracket output connectors 20 on the bracket 13.

In this configuration, the meter 12 will be measuring all of the electric current and thus will operate as normal by measuring a first amount of electric current communicated from the secondary input connectors 22, which is used by the original electric panel and circuits or components electrically connected to the secondary output connectors 24.

Shown in simple format in FIG. 4 is a rear or interior view of the body 16 of the device herein. The electric current which is communicated from the grid and utility flows from the bracket input connectors 18 (FIG. 2) to the secondary input connectors 22 is communicated through the meter 12 to the secondary output connectors 24. The secondary output connectors 24 are in electric engagement with the original bracket output connectors 20 which are operatively connected to the bus bars of an electric service panel 14 in the normal fashion.

As shown, a secondary output circuit 26 is provided through the sidewall 27 of the body 16 of the device for a second electric current supply such as with an electric receptacle outlet 32 or a secondary output circuit 26 such as through wires to a device or load 30 requiring electric current. This secondary circuit can employ one wire electrically connected to one of the secondary output connectors where 120 volts are desired or it may employ two wires with one each electrically connected to a respective on each of the pair of secondary output connectors 24.

By electrically connected herein is meant that the connection allows a flow of electric current therethrough.

This secondary output circuit 26, just like the main electric panel using the first amount of electric current, is electrically connected to the secondary output connectors 24 which receive electric power monitored through the meter 12 from the secondary input connectors 22. Thus, any electric power used by the original electric panel 14 and any electric power circuits now connected to the secondary output circuit 26 will an electric current power consumption thereof measured by the meter 16 in the normal fashion as will the electric current used by the secondary output circuit 26.

Also shown in FIG. 4 is a metering or current tracking component 29 which will be configured with circuits and if needed, computer processors and electronic memory and software operating to the task of measuring a second amount of electric current used by the secondary output circuit 26. This second amount of electric current, so measured, may be subtracted from the total amount of electric current measured by the meter 12 to determine an amount of electric current solely used by electric components engaged to the secondary output circuit, such as a vehicle charger that is operatively engaged to this secondary circuit.

As noted, where the meter 12 is a smart meter, which are well known and widely employed by electric utilities to monitor ongoing electric current use as well as to report monthly electric current use, the current metering tracking component 29 can output an electronic signal, employable by the smart meter 12, to provide the electric utility with an amount of electric current used only by the secondary circuit 26. This separation of electric current by destination will enable electric utilities to bill the second amount of electric current used by the secondary circuit 26 at a different billing rate from the billing rate for the first amount of electric current used by the existing electric panel and electric circuits connected thereto. Such will provide electric utilities the ability to encourage the use and charging of electric vehicles by discounting the billing rate for the measured electric current used for charging them which is a goal of the government in many states. Such a separated billing of different electric current streams heretofore has not been possible without a costly and significant rewiring of home and office electric panels and with meter replacements. Since this is conventionally at the expense of the owner of the property, such separate circuiting and the discounts on power usage frequently goes undone.

As also shown, in a preferred mode of the device herein, such as in FIG. 5, the secondary output circuit 26 is electrically connected to the sub panel 15 which may have one or a plurality of circuit breakers therein either directly engaged by wires to the secondary circuit 26 or to bus bars engaged therewith. While shown with a single GFI circuit breaker 28, there may also be other circuit breakers connected to this secondary output circuit 26.

A load 30, such as a vehicle charger, may be engaged with this secondary output circuit 26 and, as noted, a second amount of electric current, used by that load 30, can be determined by the tracking component 29 and subsequent reported to the electric utility. Where the meter 12 is a smart meter, the tracking component 29 may interface with the smart meter to provide reporting of the total electric current consumption and the second amount of electric current consumption of the load 30, whereby the electric utility can subtract the second amount of electric current used from the total, and bill both at different rates.

Shown in FIG. 6 is a similar but simpler mode of the system herein which positions an electrical outlet 32 positioned on a side surface of the body 16 and is electrically connected to the secondary output connectors 24. This outlet 32 such as a plug receptacle, thus. is located for direct access on the side surface of the body 16 of the interface itself. In this mode, a circuit breaker 28 may be required to be positioned within the interior of the body 16 to protect the secondary output circuit 26 from an overload. However, positioning the outlet 32 directly accessible on the side surface of the body 16 allows a user to plug in a load such as a vehicle charger at the position of the body 16 and original meter 12 which is frequently outdoors and in a position where a vehicle charger may be plugged into the outlet 32.

Shown in FIG. 7 is a rear view of the body 16 of the device herein showing the first pins 34 connected to the secondary input connector 22 and second pins 36 connected to the secondary output connectors 24. The conventional meter 12 has a pinned connection wherein it will operatively plug into both the secondary input connectors 22 and secondary output connectors 24 to measure the total electric power used.

Shown in FIG. 8 an opposite side of the body 16 view of the device as in FIG. 7. As shown, the secondary output circuit 26 is connected to the secondary output connectors 24 which are also in electrical connection with the bracket output connectors 20 supplying electric current to the service panel 14. Thus the service meter 14 will include the electric current used on the secondary output circuit as part of the total power used.

In FIG. 9 is shown an especially preferred mode of the device herein which makes it exceptionally easy for a utility to retrofit an existing service panel 14 and service meter 12 to measure the electric current used by the secondary output circuit 26 separably from that used by the circuits in the service panel 14. Connected to the body 16 is a secondary meter 38 which is positioned inline to measure the electric current used by the secondary circuit 26 separately from that used by the circuits in the service panel 14. As can be seen the secondary circuit 26 is connected to the secondary input connectors 22 locating them in front of the service meter 12. Thus, electric current used by the secondary circuit 26 is not measured by the conventional utility meter 12.

The secondary circuit runs through the secondary meter 38 which independently measures the electric current used by a load connected to the secondary circuit 26. This configuration allows a utility to simply remove the original meter 14 and plug in the device 10 herein with the first pins 34 engaged to the secondary input connectors 22 in an engagement to the bracket input connecters 18. The secondary pins 26 connected to the secondary output connectors 24 are engaged with the bracket output connectors 20. The meter 12 is then plugged into the secondary output connectors 24 and secondary input connectors 22. So positioned, the secondary meter 38 will independently monitor the aggregate electric current use by the secondary output circuit separably. Where the secondary meter 38 is a smart meter, the electric current use will be wirelessly communicated to the utility where the utility may bill the electric current used as a different rate. This mode of the device 10 allows a utility technician to simply position the body 16 in the sandwiched engagement between the original bracket 13 and the meter 12 to provide separate metering for electric vehicles or other electric devices which may be entitled to different rates.

Shown in FIG. 10 is a depiction of the body 16 of a device herein in sandwiched engagement between a meter 12 and the original bracket 13 on a service panel. As shown the secondary output circuit 26 is engaged to the body 16 through a sidewall 27 thereof. This shows the ease of the connection for the utility power company technician. A similar configuration is shown in FIG. 11, which depicts the device as in FIG. 9 so engaged to provide the secondary power meter 38 which is connected to the secondary output circuit 26 which exits the sidewall 27. A hollow member such a conduit 31 supports the secondary meter 38.

Finally, it should be noted that where the user may have a local electric generator, which is used during power outages and the like, the electric outlet 32 may be used as an inlet for power from the generator. A grid disconnect switch (not shown but well known) can be positioned within the body 16 which will react to sensing incoming electric power from the outlet 32 or from another connector, such as in the sub panel 15, and to immediately disconnect the grid and bracket input connectors 18 from the meter and from any electric connection to the outlet 32. This will enable the device 10 to function both to provide first and second electric current supplies that are separately determinable as well as a grid disconnect to allow the use of a generator to provide power through a connection such as the outlet 32, to the home or business.

As noted, any of the different configurations and components of the electric meter interface and supplemental circuit system herein, or the steps in determining the optimum configuration or construction thereof, can be employed with any other configuration or component shown and described.

Additionally, while the disclosed electric interface system for provision of supplemental electric circuits has been described herein with reference to particular embodiments thereof and components thereof operatively engaged for operation, a latitude of equivalent modifications, various changes and substitutions are intended to be included within the foregoing disclosures and it will be appreciated that in some instance some features, or configurations, or operations of the interface invention could be employed without a corresponding use of other features thereof, without departing from the scope of the invention as set forth in the following claims. All such changes, alternations and modifications as would occur to those skilled in the art subsequent to reviewing this specification, are considered to be within the scope of this invention as broadly defined in the appended claims.

Further, the purpose of any abstract of this specification is to enable the U.S. Patent and Trademark Office, the public generally, and especially the scientists, engineers, and practitioners in the art who are not familiar with patent or legal terms or phraseology, to determine quickly from a cursory inspection the nature and essence of the technical disclosure of the application. Any such abstract included herein is neither intended to define the invention of the application, which is measured by the claims, nor is it intended to be limiting, as to the scope of the invention in any way.

What is claimed is:

1. An electric power interface comprising:

a body having a first side opposite a second side and having a sidewall extending from said first side and said second side;

said body having a pair of secondary input connectors on said first side electrically connected with a pair of first pins extending from said first side of said body;

said body having a pair of secondary output connectors on said first side electrically connected with a pair of second pins extending from said first side of said body;

said body positionable to a sandwiched position in between a bracket having bracket input connectors engaged to a power grid and bracket output connectors electrically engaged to a power panel having electric circuits extending therefrom, and an electric power meter;

said pair of first pins being electrically connected to said bracket input connectors with said body in said sandwiched position;

said pair of second pins being electrically connected to said bracket output connectors with said body in said sandwiched position;

said electric power meter electrically connected with both said pair of secondary input connectors and said pair of secondary output connectors whereby electric current flowing from said pair of secondary input connectors to said pair of secondary output connectors is measured thereby;

a secondary output circuit electrically connected to at least one of said pair of secondary output connectors, whereby an electrically powered device is engageable to said secondary output circuit and powered thereby;

an electronic tracking component electrically connected with said secondary output circuit, said electronic tracking component measuring only a portion of the electric current communicated through said secondary output circuit.

2. The electric power interface of claim 1 additionally comprising:

said secondary output circuit terminating at an electrical outlet engaged with said sidewall of said body; and said electrically powered device being engageable to said electrical outlet.

3. An electric power interface comprising:

a body having a first side opposite a second side and having a sidewall extending said first side and said second side;

said body having a pair of secondary input connectors on said first side electrically connected with a pair of first pins extending from said first side of said body;

said body having a pair of secondary output connectors on said first side electrically connected with a pair of second pins extending from said first side of said body;

said body positionable to a sandwiched position in-between a bracket having bracket input connectors engaged to a power grid and bracket output connectors electrically engaged to a power panel having electric circuits extending therefrom, and an electric power meter;

said pair of first pins being electrically connected to said bracket input connectors with said body in said sandwiched position;

said pair of second pins being electrically connected to said bracket output connectors with said body in said sandwiched position;

said electric power meter electrically connected with both said pair of secondary input connectors and said pair of secondary output connectors whereby a first electric current flowing from said pair of secondary input connectors to said pair of secondary output connectors is measured thereby; and a secondary output circuit electrically connected to at least one of said pair of secondary input connectors and communicating a secondary electric current therethrough; and a secondary electric power meter operatively connected with said secondary output circuit whereby said secondary electric power meter measures only said secondary electric current flowing through said secondary output circuit whereby said secondary electric current can be determined as a portion of said first electric current.

4. The electric power interface of claim 3 additionally comprising:

said secondary output circuit terminating at an electrical outlet engaged with said sidewall of said body; and said electrical outlet being engageable with an electrically powered device to thereby power said electrically powered device.

5. The electric power interface of claim 3 additionally comprising:

said secondary output circuit having at least one wire communicating through a conduit engaged with said sidewall; and said secondary electric power meter engaged to said conduit whereby it is supported in a position adjacent said electric power meter.

* * * * *